US011060686B2

(12) United States Patent
Barqueros et al.

(10) Patent No.: US 11,060,686 B2
(45) Date of Patent: Jul. 13, 2021

(54) METHOD FOR MANUFACTURING A PRINTED CIRCUIT BOARD FOR A LIGHT MODULE OF A LIGHTING DEVICE OF A MOTOR VEHICLE

(71) Applicant: Marelli Automotive Lighting Reutlingen (Germany) GmbH, Reutlingen (DE)

(72) Inventors: Narcis Barqueros, Sabadell (ES); Martin Gottheil, Kusterdingen (DE); Michael Hiegler, Reutlingen (DE); Uwe Bormann, Heidenheim (DE)

(73) Assignee: Marelli Automotive Lighting Reutlingen (Germany) GmbH, Reutlingen (DE)

( * ) Notice: Subject to any disclaimer, the term of this patent is extended or adjusted under 35 U.S.C. 154(b) by 0 days.

(21) Appl. No.: 16/071,683

(22) PCT Filed: Jan. 25, 2017

(86) PCT No.: PCT/EP2017/051552
§ 371 (c)(1),
(2) Date: Jul. 20, 2018

(87) PCT Pub. No.: WO2017/129619
PCT Pub. Date: Aug. 3, 2017

(65) Prior Publication Data
US 2019/0353318 A1  Nov. 21, 2019

(30) Foreign Application Priority Data
Jan. 27, 2016  (DE) ..................... 10 2016 201 206.1

(51) Int. Cl.
*F21S 41/19* (2018.01)
*F21S 41/39* (2018.01)
(Continued)

(52) U.S. Cl.
CPC ............. *F21S 41/39* (2018.01); *F21S 41/141* (2018.01); *H05K 3/303* (2013.01); *F21S 41/192* (2018.01);
(Continued)

(58) Field of Classification Search
CPC ........ F21S 41/141; F21S 41/39; F21S 41/192; F21S 41/29; H05K 3/303; H05K 1/0269; H05K 2201/10106; H05K 2201/2054
See application file for complete search history.

(56) References Cited

U.S. PATENT DOCUMENTS 9,605,826 B2 *  3/2017  Cabanne ................. F21S 41/39
10,147,683 B2 * 12/2018  Haefner .............. H01L 25/0753
(Continued)

FOREIGN PATENT DOCUMENTS

CN  103574526 A  2/2014
CN  104541099 A  4/2015
(Continued)

OTHER PUBLICATIONS

International Search Report for PCT International Application No. PCT/EP2017/051552 dated Apr. 18, 2017.
(Continued)

*Primary Examiner* — Arman B Fallahkhair
(74) *Attorney, Agent, or Firm* — Howard & Howard Attorneys PLLC

(57) ABSTRACT

A method for machining a holding device for a light module of a lighting device of a motor vehicle. An SMD semiconductor light source component arranged on the holding device is operated for light generation. An emission characteristic of a light-emitting surface of the SMD semiconductor light source component is determined. A mechanical feature with regard to the holding device is specified depending upon the emission characteristic. An optical
(Continued)

element which co-operates optically with the SMD semiconductor light source component is specified depending upon the mechanical feature with regard to the SMD semiconductor light source component.

8 Claims, 4 Drawing Sheets

(51) Int. Cl.
  *F21S 41/141*  (2018.01)
  *H05K 3/30*  (2006.01)
  *F21Y 115/30*  (2016.01)
  *F21Y 115/10*  (2016.01)
  *F21S 41/29*  (2018.01)
  *H05K 1/02*  (2006.01)

(52) U.S. Cl.
  CPC ............ *F21S 41/29* (2018.01); *F21Y 2115/10* (2016.08); *F21Y 2115/30* (2016.08); *H05K 1/0269* (2013.01); *H05K 2201/10106* (2013.01); *H05K 2201/2054* (2013.01); *Y02P 70/50* (2015.11)

(56) References Cited

U.S. PATENT DOCUMENTS

| | | | |
|---|---|---|---|
| 10,631,414 B2* | 4/2020 | Barqueros | H05K 3/305 |
| 2005/0180157 A1 | 8/2005 | Watanabe et al. | |
| 2012/0074438 A1* | 3/2012 | Hwang | H01L 33/0095 |
| | | | 257/88 |
| 2013/0100685 A1* | 4/2013 | Weekamp | F21S 41/39 |
| | | | 362/382 |
| 2013/0215632 A1* | 8/2013 | Jackl | F21S 41/192 |
| | | | 362/514 |
| 2014/0109785 A1* | 4/2014 | Pauliac | B82Y 10/00 |
| | | | 101/450.1 |
| 2015/0211843 A1* | 7/2015 | Petsch | F21S 41/19 |
| | | | 29/834 |
| 2015/0228549 A1* | 8/2015 | Mattina | H01L 25/0753 |
| | | | 257/88 |
| 2015/0241011 A1 | 8/2015 | Bauer et al. | |
| 2015/0364384 A1* | 12/2015 | Karch | H05K 13/046 |
| | | | 438/4 |
| 2016/0197044 A1 | 7/2016 | Haefner et al. | |
| 2018/0153064 A1* | 5/2018 | Zorn | H05K 13/08 |

FOREIGN PATENT DOCUMENTS

| | | |
|---|---|---|
| CN | 104976533 A | 10/2015 |
| CN | 105650564 A | 6/2016 |
| DE | 102005003213 A1 | 8/2005 |
| DE | 102014005298 A1 | 9/2014 |
| DE | 102014101784 A1 | 8/2015 |
| DE | 102014210654 A1 | 12/2015 |
| EP | 2693108 A1 | 2/2014 |
| EP | 3030055 A1 | 6/2016 |
| WO | 2014028954 A1 | 2/2014 |
| WO | 2014056012 A1 | 4/2014 |
| WO | 2014153576 A1 | 10/2014 |
| WO | 2015000894 A1 | 1/2015 |
| WO | 2015040108 A1 | 3/2015 |
| WO | 2016094913 A1 | 6/2016 |

OTHER PUBLICATIONS

Written Opinion of the International Searching Authority for PCT International Application No. PCT/EP2017/051552 dated Apr. 18, 2017.

* cited by examiner

METHOD FOR MANUFACTURING A PRINTED CIRCUIT BOARD FOR A LIGHT MODULE OF A LIGHTING DEVICE OF A MOTOR VEHICLE

CROSS-REFERENCE TO RELATED APPLICATIONS

The present application is a National Stage of International Patent Application No. PCT PCT/EP2017/051552, filed on Jan. 25, 2017, which claims priority to and all the benefits of German Patent Application No. 10 2016 201 206.1, filed on Jan. 27, 2016, both of which are hereby expressly incorporated herein by reference in their entirety.

BACKGROUND OF THE INVENTION

1. Field of the Invention

The invention relates to a method for machining a holding device for a light module.

Placement of SMD electronic components on a printed circuit board, in particular with a reflow soldering, is accompanied with high tolerances with respect to the positioning precision.

2. Description of the Related Art

A method for producing an interconnect device that has at least one surface-mounted SMD semiconductor light source component is known from WO 2014/153576. At least one SMD LED is positioned on the interconnect device. The position of the light emitting region of the at least one SMD-LED is detected optically, and the at least one SMD-LED is mounted on the interconnect device based on the detected position of the light emitting region of the at least one SMD-LED.

SUMMARY OF THE INVENTION

One of the objects of the invention is to compensate for tolerances resulting during the placement of the SMD semiconductor light source component on a light module of a lighting device of a motor vehicle.

The fundamental object of the invention is achieved by a method for machining a holding device. Important features of the invention are also explained in the following description and illustrated in the drawings, wherein the features may be important to the invention in and of themselves as well as in different combinations, without explicit indication thereof.

Light is generated by an SMD semiconductor light source component disposed on the holding device. A light emission characteristic is determined for a light emitting surface of the SMD semiconductor light source component. The position of mechanical feature of the holding device is determined based on the characteristic of the light emission. The position of an optics element interacting with the SMD semiconductor light source component is determined based on the position of the mechanical feature in relation to the SMD semiconductor light source component.

The light emitting surface of an SMD semiconductor light source component does not always emit a homogenous light, and may have a different light center or light distribution over the light emitting surface from one SMD semiconductor light source component to another SMD semiconductor light source component.

With the proposed method, a displacement due to tolerances, which would lead to a light emission distribution not complying with specifications, can advantageously be prevented. Particularly tolerances relating to the light emission characteristic of the light emitting surface and/or the position of the SMD semiconductor light source component on the holding device can thus be easily compensated for.

Advantageously, other measures relating to the precise positioning of the SMD semiconductor light source component in relation to the holding device are no longer necessary. Moreover, less expensive SMD semiconductor light source components can be used, which exhibit a higher variation in the light distribution over the light emitting surface. As a result, a light module can be produced on the whole, which is characterized by a more precise light emission distribution at lower costs.

In one advantageous embodiment, first coordinates of an actual light center of the light emission characteristic are determined. The first coordinates are compared with second coordinates of a target light center of the light emission characteristic. The position of the mechanical feature with respect to the holding device is determined based on the results of the comparison. The position of the mechanical feature can thus be determined advantageously from the comparison.

In one advantageous embodiment, the optics element is secured in place by a respective attachment member that attaches to the mechanical feature. The mechanical feature can also be used directly for securing the optics element in place.

In an advantageous embodiment, coordinates of the mechanical feature are detected optically. The optics element is secured in place on the holding device based on the coordinates of the mechanical feature. The light emission characteristics of the light emitting surface with respect to the holding element can be advantageously determined via the position of the mechanical feature, and in a subsequent machining step, the optics element can be secured in place. Advantageously, other components can thus also be placed on the holding device in relation to the position of the mechanical feature. Moreover, the optical detection of the coordinates of the mechanical feature provide a possibility for rejecting a holding device in the framework of quality control when the coordinates of the mechanical feature are too far from the target coordinates.

In one advantageous embodiment, the mechanical feature comprises a hole passing through the holding device. The positioning of the hole comprises drilling a hole through the holding device. The mechanical feature can be formed in this manner in the holding device.

In one advantageous embodiment, the mechanical feature is a reference element. The positioning of the reference element comprises placing the reference element on the side of the holding device on which the SMD semiconductor light source component is placed. The detection of the coordinates can advantageously be improved through the reference element.

In one advantageous further development, the reference element comprises a detection feature spaced apart from the surface of the holding device. Advantageously, shadows cast by other components are thus reduced, and a focusing on the removed detection feature can advantageously lead to a more precise determination of the position of the reference element on the holding device.

BRIEF DESCRIPTION OF THE DRAWINGS

Further features, application possibilities and advantages of the invention can be derived from the following description of exemplary embodiments of the invention, which are illustrated in the drawings. The same reference symbols are used in all of the figures for variables and features having equivalent functions, even with different embodiments. Therein.

DETAILED DESCRIPTION OF THE INVENTION

Figure 1:
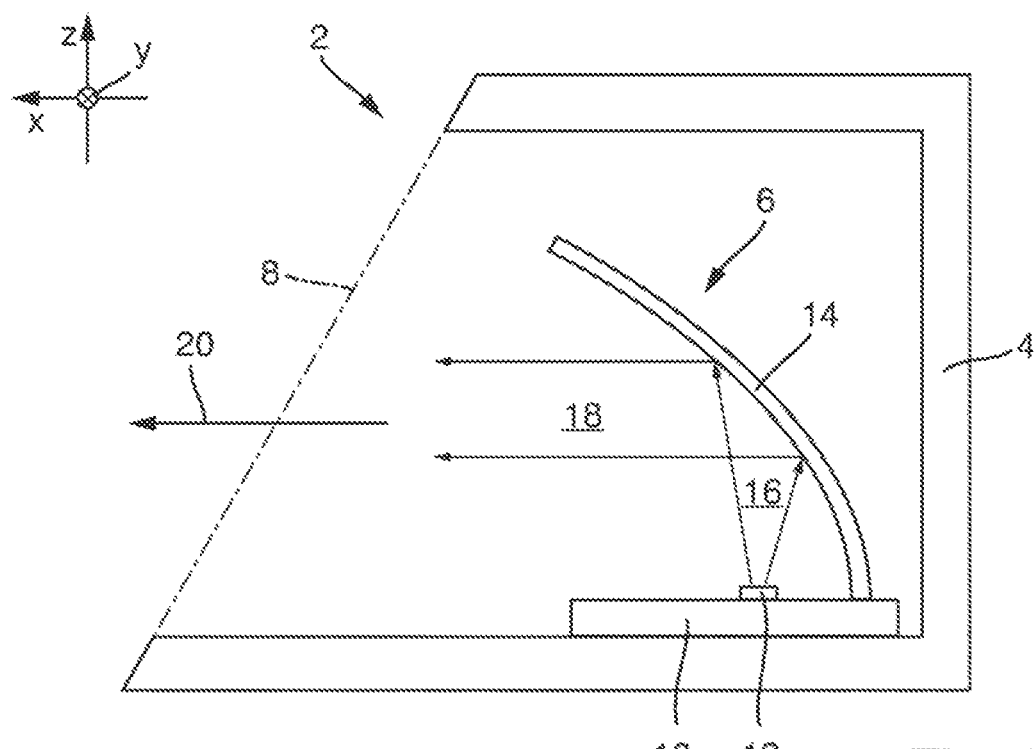
FIG. 1 shows a schematic sectional view of a lighting device of a motor vehicle.

FIG. 1 shows a lighting device 2 of a motor vehicle in a schematic form, which is designed as a headlamp in the present example. The lighting device 2 comprises a housing 4 in which a light module 6 is disposed. A light emission opening in the housing 5 is closed with a cover plate 8.

The light module 6 comprises a holding device 10 on which an SMD semiconductor light source component 12 is disposed. An optics element 14 is likewise disposed on the holding device 10, which is designed as a reflector in the present example. As a matter of course, a transmission element can be placed on the holding device 10 instead of a reflector. The holding device 10 can be a printed circuit board, by way of example. Other embodiments are also conceivable, as a matter of course, in which the SMD semiconductor light source component 12 is disposed on a printed circuit board, and the printed circuit board is disposed on the holding device 10, wherein the holding device 10 does not need to be a printed circuit board, but can also be designed as a cooling element or an element with another function.

The SMD semiconductor light source component 12 generates a primary light distribution 16, which is converted to a secondary light distribution 18 by the optics element 14. The secondary light distribution 18 is emitted by the lighting device 2 in a main beam direction 20 for lighting a roadway in the direction of travel. The placement of the SMD semiconductor light source component 12 in relation to the optics element is also decisive for the positioning and generation of the secondary light distribution 18.

Figure 2:
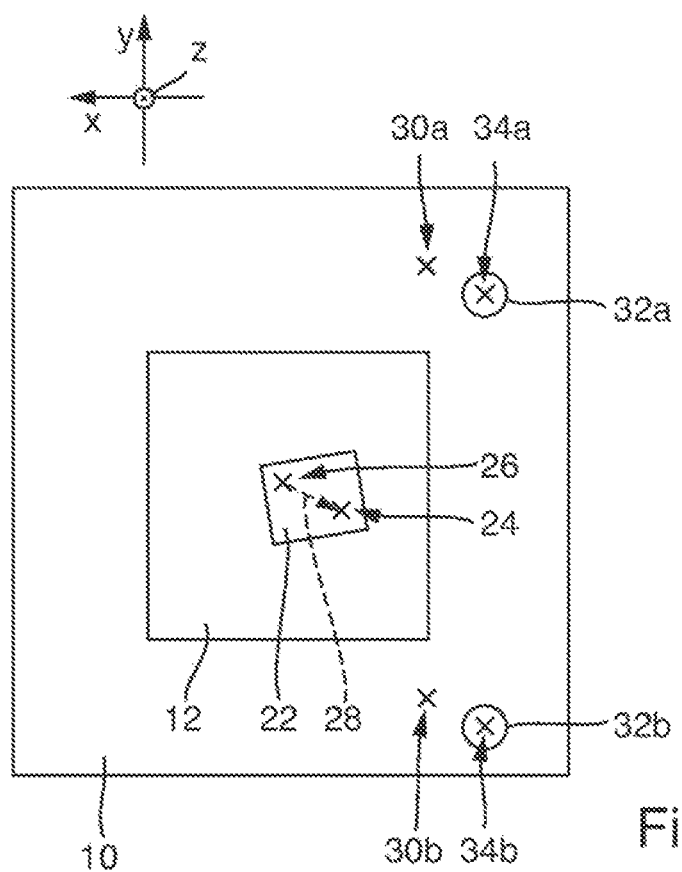
FIG. 2 shows a schematic top view of a holding device for a light module.

FIG. 2 shows a schematic top view of the holding device 10, on which the SMD semiconductor light source component 12 is disposed. The SMD semiconductor light source component 12 comprises a light emitting surface 22. A light emission characteristic is determined by an optical inspection system, e.g. in the form shown in the present top view. First coordinates 24 of an actual light center of the light emitting surface 22 can be determined from the light emission characteristic. The first coordinates 24 relate to a coordinate system that is established in relation to the holding device 10. Second coordinates 26, also relating to the same aforementioned coordinate system, represent a target light center of the light emitting surface 22. By comparing the first coordinates 24 with the second coordinates 26, a displacement vector 28 can be determined. Target coordinates 30 for determining the position of a mechanical feature 32a, 32b are transformed as a function of the displacement vector 28 to actual coordinates 34a, 34b, in order to determine or establish the position of the actual coordinates 34a, 34b of the respective mechanical feature 32a, 32b.

The mechanical feature 32a, 32b is a through hole in the present example, which is placed at the actual coordinates 34a, 34b by the holding device 10. The optics element 14 is secured in place in relation to the holding device 10 by an attachment member formed thereon, which engages in the through hole forming the mechanical feature 32a, 32b.

In another embodiment, the through hole can be detected optically, and the optics element is connected to the holding device, e.g. by an adhesive, at a location removed from the mechanical feature 32a, 32b, based on the detected actual coordinates 34a, 34b.

Figure 3:
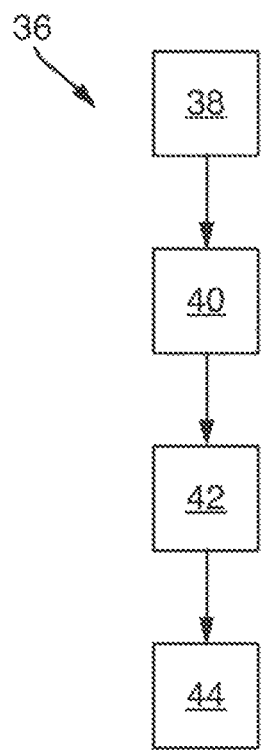
FIG. 3 shows a schematic flow chart.

FIG. 3 shows a schematic flow chart 36. In a first step 38, the SMD semiconductor light source component 12 disposed on the holding device 10 generates light. In a second step 40, the light emission characteristic of the light emitting surface 22 of the SMD semiconductor light source component 12 is determined. In a third step 42, the position of the mechanical feature 32 in relation to the holding device 10 is determined based on the light emission characteristic. The third step 42 comprises drilling a hole in the holding device 10 at the coordinated 34a, 34b. In a fourth step 44, the position of the optics element 14 interacting optically with the SMD semiconductor light source component 12 is determined in relation to the SMD semiconductor light source component 12 based on the position of the mechanical feature 32a, 32b.

Figure 4:
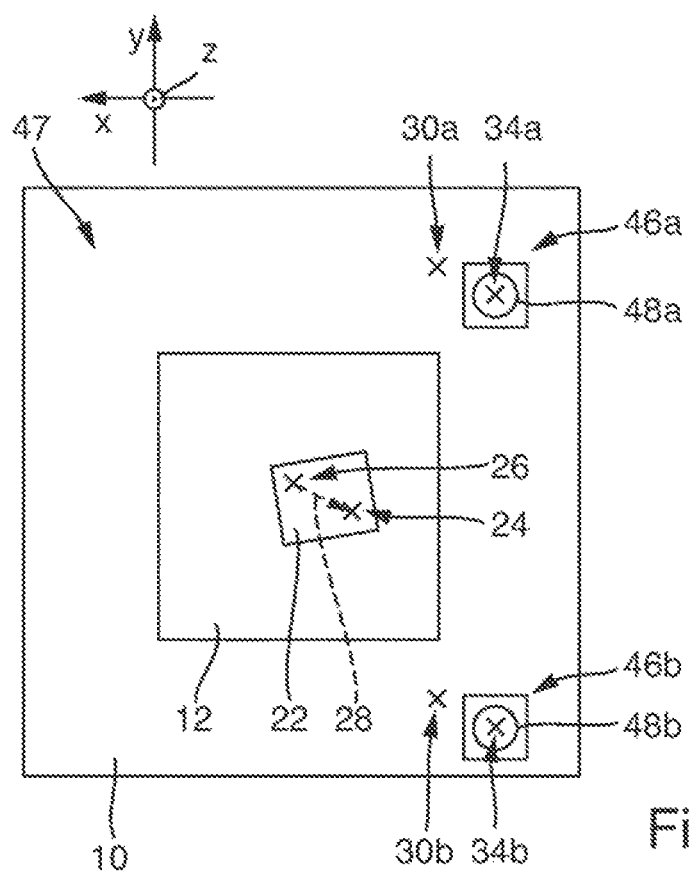
FIG. 4 shows another schematic top view of a holding device for a light module.

FIG. 4 shows the holding device 10 in a schematic top view. A mechanical feature 46a, 46b in the form of a reference element in the present example is disposed on a surface 47 of the holding device 10 on which the SMD semiconductor light source component 12 is located. Determining the position of the reference element also means that the reference element must be located on the same side of the holding device 10 that the SMD semiconductor light source component 12 is disposed on. The mechanical feature 46a, 46b comprises a detection feature 48a, 48b at a distance to the surface 47. The actual coordinates 34a, 34b for further production steps are made available by the detection feature 48a, 48b, thus documenting the first coordinates 34 of the actual light center of the light emitting surface 22.

Figure 5:
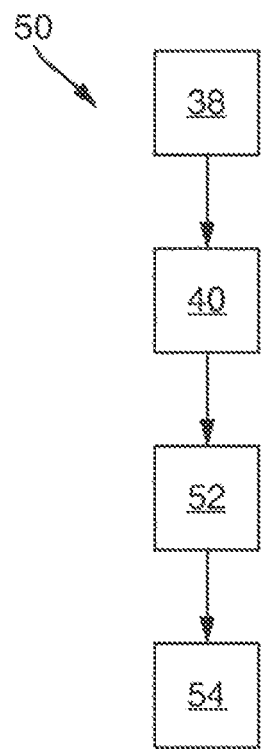
FIG. 5 shows another schematic flow chart.

FIG. 5 shows a schematic flow chart 50. In differing from the flow chart 36 in FIG. 3, a third step 52 is carried out in FIG. 5 after the second step 40. In the third step 52, the mechanical feature 46a, 46b is secured in place in relation to the holding device 10 by an adhesive process and a corresponding adhesive. In a fourth step 54, following the third step 52, the position of the detection feature 48a, 48b and thus the coordinates 34a, 34b, are determined by the optical inspection system. The optics components that interact optically with the SMD semiconductor light source component 12 can then be secured in place, or attached, in relation to the holding device 10, based on the coordinates 34a, 34b.

Figure 6:
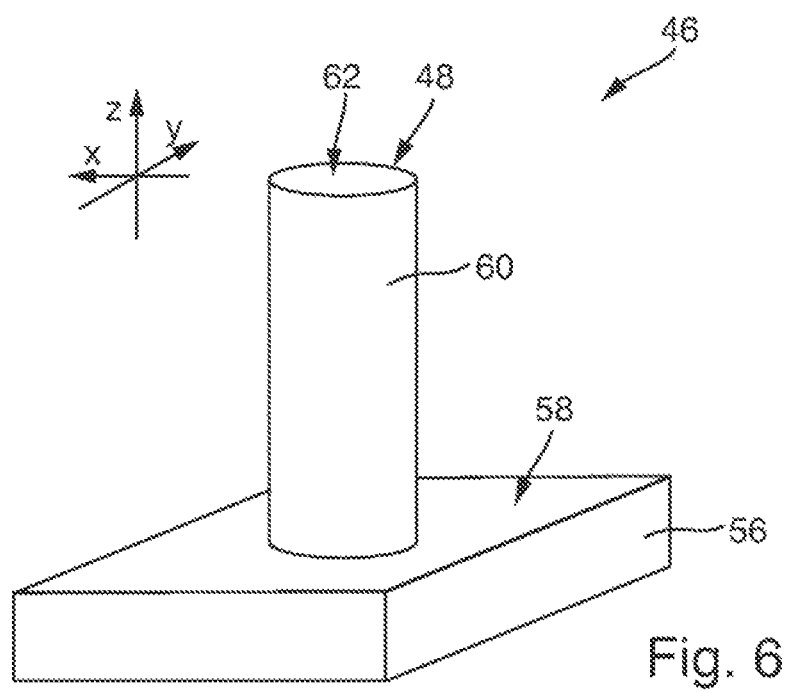
FIG. 6 shows a reference element in a perspective view.

FIG. 6 shows an embodiment of the mechanical feature 46. The mechanical feature 46 comprises a base 56 that can be placed on the surface 47 of the holding device 10. A cylinder 60 extends from a surface 58 of the base 56, which ends at a circular surface 62. The circular surface 62 comprises an edge that forms the detection feature 48. The detection feature 48 is thus removed from the surface 47 of the holding device 10, and disposed at a distance to the surface 58 of the mechanical feature 46, and can be easily brought into focus and detected due to this spacing.

In one embodiment, the circular surface 62 has a first coloring that differs from a second coloring of the surface 58. If the mechanical feature 46 is illuminated, light is reflected by the circular surface 62 at a first wavelength, and from the surface 58 at a second wavelength, wherein the first wavelength differs from the second wavelength by at least 50 nm. In this manner, detection of the detection feature 48 can be improved.

Figure 7:
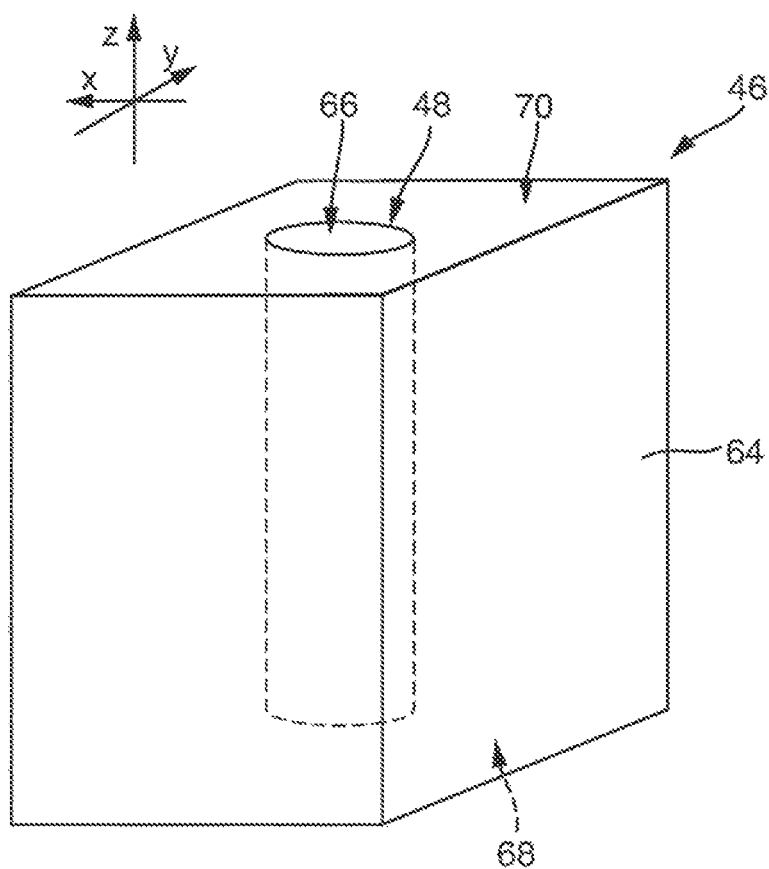
FIG. 7 shows another reference element in a perspective view.

FIG. 7 shows another embodiment of the mechanical feature 46. A cube 64 comprises a through hole 66. An undersurface 68 is placed on the surface 47. An upper surface 70 is located at a distance to the undersurface 68, and thus to the surface 47. The through hole 66 forms the detection feature 48 on the upper surface 70, which is an edge in the present example, and at a distance to the surface 47 of the holding device, such that it can be readily brought into focus by the optical inspection system, and cannot be shaded by other components.

The invention has been described in an illustrative manner. It is to be understood that the terminology which has been used is intended to be in the nature of words of description rather than of limitation. Many modifications and variations of the invention are possible in light of the above teachings. Therefore, within the scope of the appended claims, the invention may be practiced other than as specifically described.

The invention claimed is:

1. A method for manufacturing a printed circuit board for a light module of a lighting device of a motor vehicle, said method comprising:
   operating an SMD semiconductor light source component, which has an inhomogeneous light distribution as a single part in itself and which is disposed on the printed circuit board, to generate light,
   determining a light emission characteristic of a light emitting surface of the light-generating SMD semiconductor light source component,
   determining first coordinates of an actual light center of the light emitting surface based on the light emission characteristic,
   comparing the first coordinates with provided second coordinates of a target light center of the light emitting surface,
   fixing a mechanical feature to the printed circuit board based on the comparison,
   optically determining a position of the mechanical feature, and
   fixing an optics element, which is intended to optically interact with the SMD semiconductor light source component, to the printed circuit board based on the optically determined position of the mechanical feature.

2. The method as set forth in claim 1, wherein the mechanical feature is a reference element, and wherein the positioning of the reference element comprises placing the reference element on the side of the printed circuit board on which the SMD semiconductor light source component is disposed.

3. The method as set forth in claim 2, wherein the reference element comprises a detection feature that is removed from the surface of the printed circuit board.

4. A printed circuit board for a light module of a lighting device of a motor vehicle, which is produced according to the method of claim 1.

5. A light module of a lighting device of a motor vehicle that comprises the printed circuit board according to claim 4.

6. The method as set forth in claim 1, wherein the position of the optics element in relation to the printed circuit board is determined by the respective an attachment member that engages with the mechanical feature.

7. The method as set forth in claim 1, wherein coordinates of the mechanical feature are detected optically, and wherein the position of the optics element in relation to the printed circuit board is determined based on the coordinates of the mechanical feature.

8. The method as set forth in claim 1, wherein the mechanical feature is a hole passing through the printed circuit board, and wherein said hole is created by drilling through the printed circuit board.

* * * * *